US010938380B1

(12) United States Patent
Fayazi et al.

(10) Patent No.: US 10,938,380 B1
(45) Date of Patent: Mar. 2, 2021

(54) METHOD AND APPARATUS FOR BIAS CURRENT TRIMMING

(71) Applicant: Apple Inc., Cupertino, CA (US)

(72) Inventors: Mohammadhasan Fayazi, San Jose, CA (US); Pablo Moreno Galbis, Burlingame, CA (US); Stanley Bo-Ting Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/707,873

(22) Filed: Dec. 9, 2019

(51) Int. Cl.
*H03K 3/03* (2006.01)
(52) U.S. Cl.
CPC .................... *H03K 3/0315* (2013.01)
(58) Field of Classification Search
CPC ...................................... H03K 3/0315
USPC ............................................ 331/57
See application file for complete search history.

(56) References Cited

U.S. PATENT DOCUMENTS

| 5,606,731 | A | 2/1997 | Pace et al. |
| 6,803,831 | B2 | 10/2004 | Nishikido |
| 7,679,467 | B2 * | 3/2010 | Hirata ............... H03L 7/0995 331/185 |
| 9,438,205 | B2 | 9/2016 | Kim et al. |
| 10,454,665 | B2 | 10/2019 | Iguchi et al. |
| 2011/0057736 | A1 | 3/2011 | Badillo |
| 2012/0098604 | A1 | 4/2012 | Lee |

* cited by examiner

*Primary Examiner* — Joseph Chang
(74) *Attorney, Agent, or Firm* — Kowert, Hood, Munyon, Rankin & Goetzel, P.C.; Erik A. Heter (57) ABSTRACT

A bias current circuit is disclosed. The bias current circuit includes a number of current sources that can selectively be coupled to a bias current node or an auxiliary node. The bias current may be provided through the bias current node. During a trimming operation, a control circuit may selectively couple particular ones of the current sources to the bias current node, in accordance with a desired bias current. Other ones of the current sources may be coupled to the auxiliary node, through which an auxiliary current is provided. Upon completing the trimming operation, the control circuit may cause the auxiliary current to be reduced to zero.

20 Claims, 6 Drawing Sheets

METHOD AND APPARATUS FOR BIAS CURRENT TRIMMING

BACKGROUND

Technical Field

This disclosure is directed to electronic circuits, and more particularly, to circuits used to trim a bias current provided by a bias current circuit.

Description of the Related Art

Oscillator circuits, such as ring oscillators, are widely used in modern integrated circuits, such as system-on-a-chip (SOC) and other types of integrated circuits. The uses of oscillators includes generation of various types of periodic signals, such as clock signals, radio frequency (RF) signals, and so on.

Oscillators may be implemented in a number of different circuit configurations. One type of oscillator includes an inductive/capacitive (LC) tank circuit, with the frequency of an output signal being at least partially dependent on the inductance of an inductor and capacitance of a capacitor used therein. Another common type of oscillator is a ring oscillator that may be implemented using an odd number of inverting circuits (e.g., inverters, inverter-coupled NAND gates, etc.).

For many oscillators, the frequency of the output signal may vary with current. Accordingly, bias circuits may be used with such oscillators. A bias circuit may generate a bias current that is provided to the ring oscillator. By varying the bias current to a desired value, the frequency of the oscillator can be controlled.

SUMMARY

A bias current circuit is disclosed. In one embodiment, a bias current circuit includes a number of current sources that can selectively be coupled to a bias current node or an auxiliary node. The bias current may be provided through the bias current node. During a trimming operation, a control circuit may selectively couple particular ones of the current sources to the bias current node, in accordance with a desired bias current. Other ones of the current sources may be coupled to the auxiliary node, through which an auxiliary current is provided. Upon completing the trimming operation, the control circuit may cause the auxiliary current to be reduced to zero.

In one embodiment, the bias current circuit includes a diode-coupled transistor and a number of current source transistors coupled thereto so as to form a number of current mirrors. Each of the current mirrors may be switchably coupled to either the bias current node or the auxiliary current node. The control circuit may couple selected ones of the current source transistors (which may be weighted, e.g., binary or unary) to the bias current node. During the trimming operation, the current source transistors not coupled to the bias current node may be coupled to the auxiliary node. The transistors selected for coupling to each of the bias current and auxiliary current nodes may be determined by a code provided to the control circuit.

In one embodiment, the bias current circuit may be used to generate a bias current for an oscillator, such as a ring oscillator. A frequency of a periodic output signal provided by the oscillator may depend, at least in part, on the amount of bias current. Accordingly, the trimming operation performed by the bias current circuit may correspondingly trim the frequency of the output circuit provided by the oscillator.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a bias current circuit, including a method and circuitry therein for trimming the bias current provided thereby. While the disclosure herein is directed to the use of the bias circuit with an oscillator (e.g., a ring oscillator) and frequency trimming via trimming of the bias current, it is noted that the circuit is not limited to such applications. In general, the bias circuit disclosed herein may be used with any type of circuitry or application in which a bias current and trimming of the same are desirable.

Applications involving oscillators, the trimming of the bias current may be performed to trim the frequency of the oscillator output signal. The frequency of an oscillator output signal may, in many contexts, vary significantly with process, voltage, and temperature. Accordingly, such oscillators may be calibrated to provide an output signal at a frequency that is well controlled and is independent of these variations. This can be done in many cases by utilizing a bias circuit that provides a bias current to the oscillator.

During the calibration of an oscillator signal frequency, the trimming operation can lead to sudden frequency changes. These artifacts can include frequency undershoots, overshoots, and various glitches. When implemented on an integrated circuit, these artifacts can be passed downstream to, e.g., blocks of digital circuitry, and can lead to malfunctions and failures therein. Accordingly, many oscillators have very stringent operational requirements from power up to power down.

In the present disclosure, a bias circuit and method for operating the same is disclosed in which an oscillator can be calibrated largely without introduction of the various types of artifacts discussed above. The bias circuit may allow the calibration through adjustment and setting of a bias current to control the loading and power overhead. As a result, the bias current, and thus the frequency produced by the oscillator, can be trimmed while avoiding the issues discussed above. Various embodiments of such a circuit are now discussed in further detail.

Figure 1:
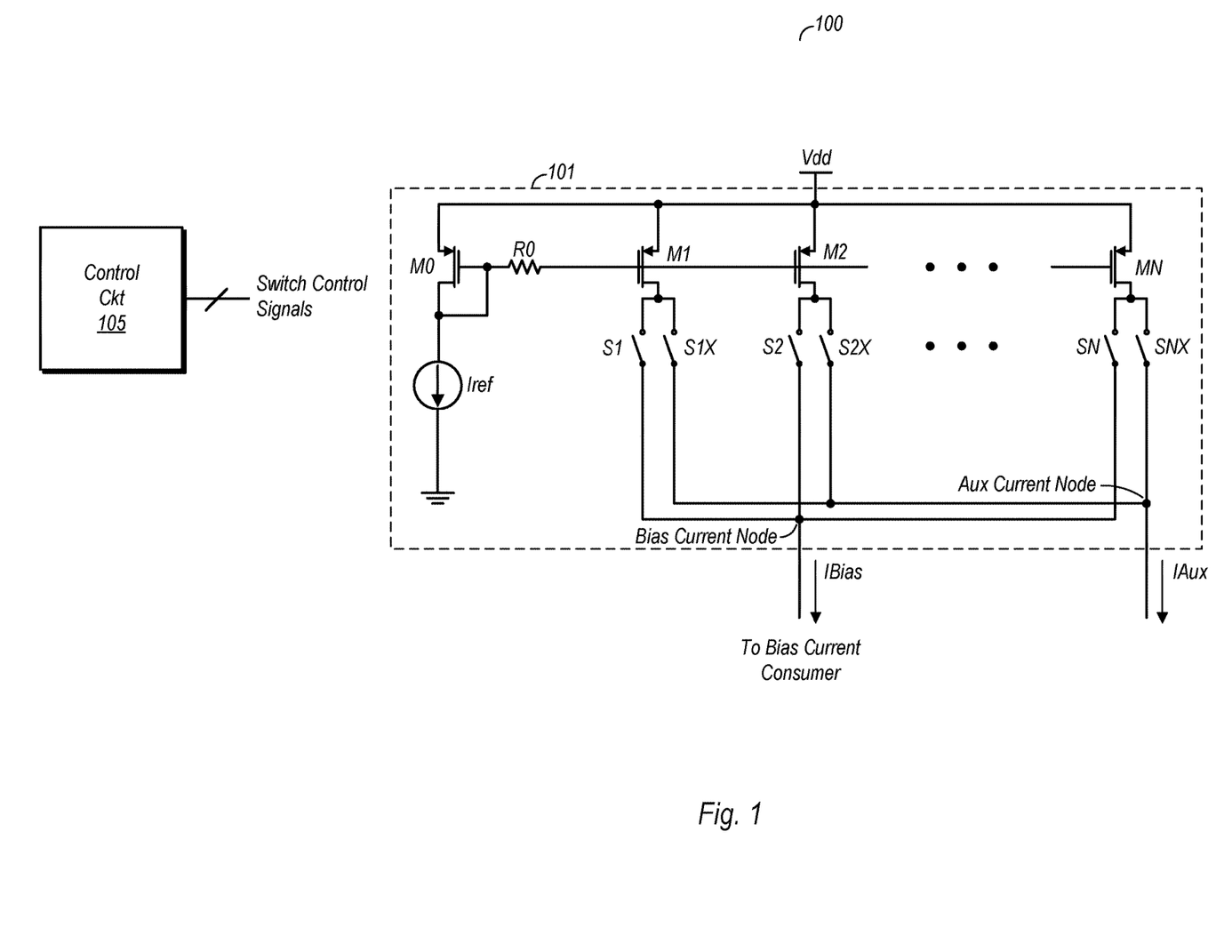
FIG. 1 is a schematic diagram of one embodiment of a bias current circuit coupled to an oscillator and a control circuit.

FIG. 1 is a schematic diagram of one embodiment of a bias circuit. In the embodiment shown, bias circuit includes a control circuit 105 and a bias current circuit 101. Bias current circuit 101 in the embodiment shown may generate and provide the bias current, IBias, under control of control circuit 105.

In the embodiment shown bias current circuit 101 includes a diode-coupled transistor M0, which includes a drain terminal coupled to a reference current source, Iref. A Bias current circuit 101 also includes a number of transistors M1, M2, etc., up to MN (where N is an integer number) that are each coupled to M0 to form a number of current mirrors. In some embodiments, a respective transistor of M1 to MN corresponds to a respective and/or corresponding current mirror. The number of transistors (or value of N) can be any suitable number for the given application of bias circuit 100. Each of transistors M1 to MN serves as a current source that can provide at least a portion of the bias current.

In this particular embodiment, a resistor R0 is coupled between the gate of M0 and the gate of the other current mirror transistors (alternatively referred to as current sources). The presence of R0 may filter out a least some of the noise from the reference current branch of the circuit that includes M0.

In various embodiments, the sizing of the current mirror transistors M1-MN may be weighted, with corresponding current carrying capacity also weighted. In some embodiments, the weighting may be unary weighting (which may be referred to as thermometer code), while in others, the weighting may be binary. Still, other embodiments are possible and contemplated in which the transistors are not weighted with respect to one another and are each of substantially the same size.

In the embodiment shown, the drain terminals of each of the current mirror transistors M1-MN is coupled to two different current paths. A first of these current paths may be referred to as the bias current path, coupling each transistor, through a corresponding switch, to the bias current node. Accordingly, the embodiment shown includes switches S1, S2, etc., to switch SN. Each of these switches, when closed, couples its corresponding transistor to the bias current node. Accordingly, when a switch is closed, its corresponding transistor contributes to the bias current.

Each of the current mirror transistors M1-MN may also be coupled to an auxiliary current node. Accordingly, switches S1X, S2X, etc., to SNX are implemented. Each of these switches may, when closed, couple its corresponding transistor to the auxiliary current node, thereby contributing to that current. It is noted that each of the switches S1X, etc., operates in a complementary manner relative to the other switch coupled to that transistor. For example, when S1 is closed, S1X is open, while S1 is open when S1X is closed. In other words, S1 and S1X may be in opposite states, and more generally, the switches coupling to the bias current node may be in the opposite state of those coupling to the auxiliary current node at any given time.

Control of the switches shown here may be performed by control circuit 105. In one embodiment, control circuit 105 may receive a code corresponding to a desired bias current value. Based on this code, control circuit 105 may generate control signals to selectively couple particular ones of the current mirror transistors to the bias current node (e.g., a first subset) while coupling others to the auxiliary current node (e.g., a second subset). During a trimming operation, control circuit 105 may selectively couple a first subset of the current source transistors M1-MN to the bias current, while selectively coupling a second subset of the current source transistors to the auxiliary current node. This may result in a desired value of bias current being provided from the bias circuit.

Providing the auxiliary current path may reduce some of the potential artifacts that could be introduced during calibration. Turning the various switches on and/or off can affect the gate voltages on all of the transistors in the illustrated configuration, given that certain transistors will turn on while others will turn off. In providing the auxiliary current path, disturbances to the gate voltage of each transistor in the illustrated configuration may be reduced, and may even be negligible to the point that no significant artifacts are induced. In particular, when switching a given one of transistors M1-MN between sourcing current to the auxiliary current path to sourcing current to the bias current path, or vice versa, the given transistor may nevertheless remain turned on. Therefore, the switching operation has a reduced effect, if any, on the loading of the individual ones of transistors M1-MN.

It is noted that these switches, in at least some embodiments, do not have dynamic behavior during operation of the circuit. That is, once the switch positions are set, they remain set in the same positions for the remainder of that operational session until power off.

Figure 2:
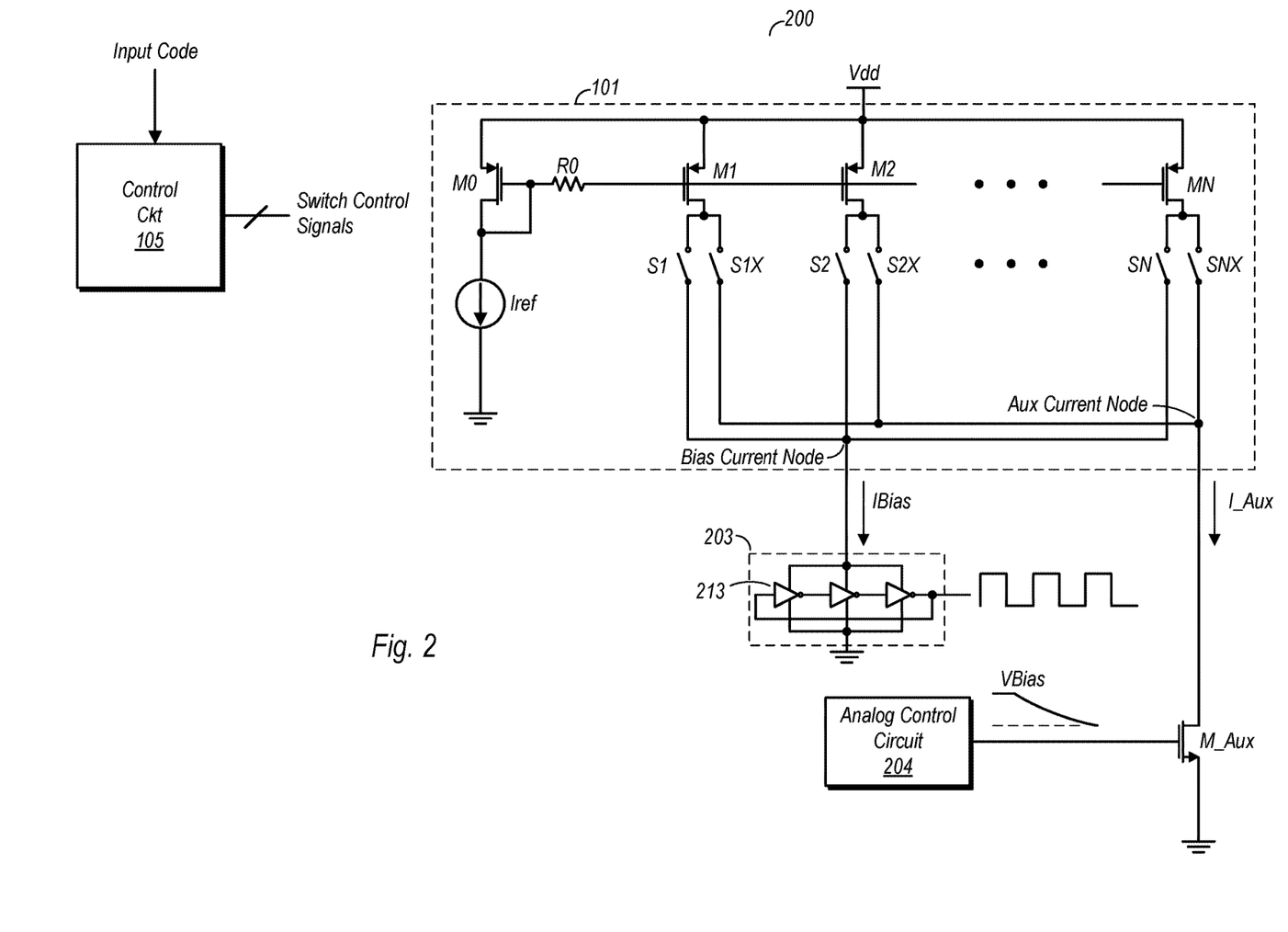
FIG. 2 is a schematic diagram of an embodiment of a bias current circuit including an auxiliary transistor and an analog control circuit coupled to a gate terminal thereof.
Figure 3:
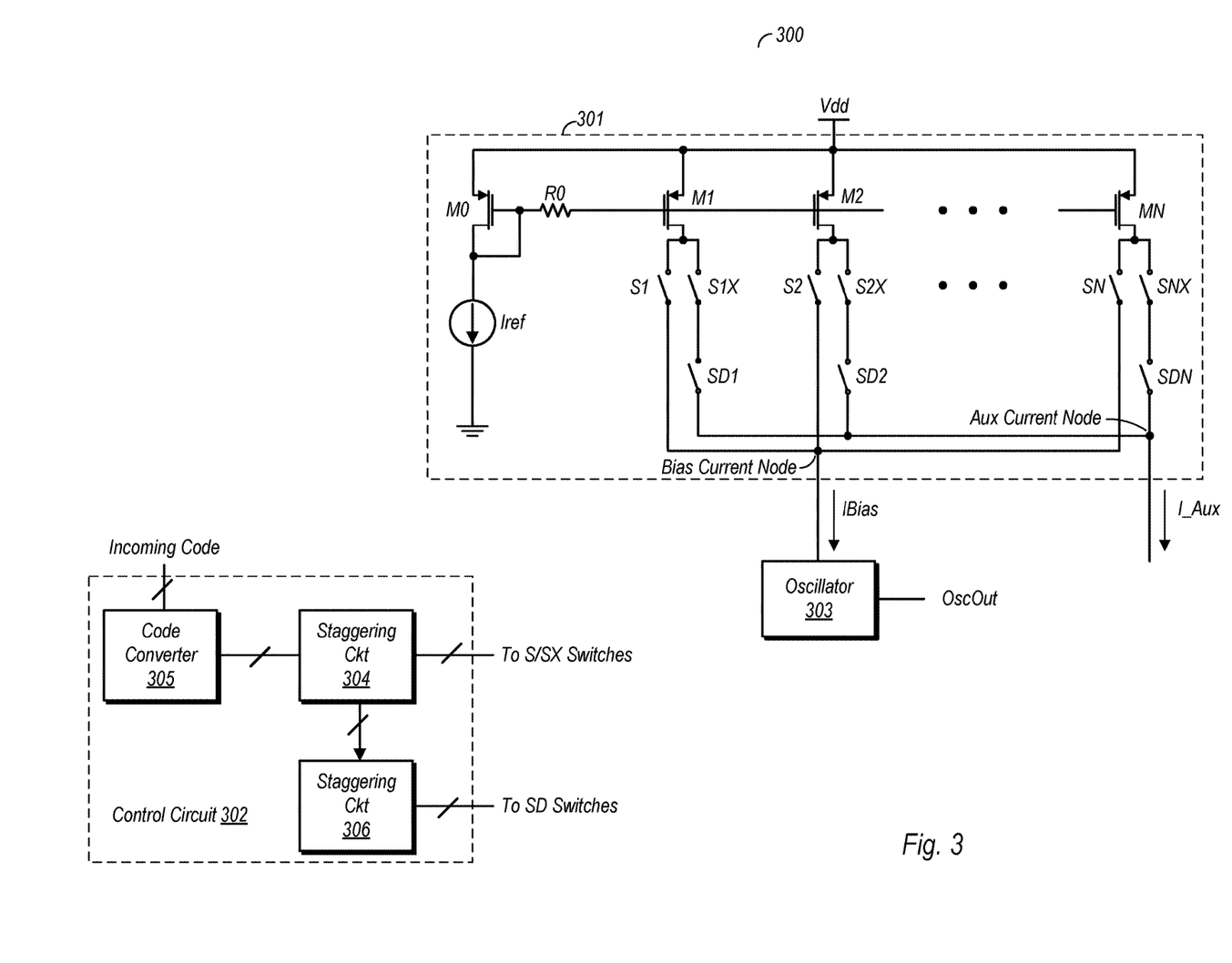
FIG. 3 is a schematic diagram of an embodiment of a bias current circuit including switching circuits arranged to decouple selected current sources from the auxiliary node upon completing a trimming operation.

Although it is desirable to keep all transistors on and providing current during the calibration operation, to reduce artifacts, it is recognized that the continuance of providing current to the auxiliary current node would consume extra power, as the auxiliary current does not provide any additional functionality subsequent to completing the calibration. Accordingly, the transistors coupled to the auxiliary current node upon completion of calibration may be turned off thereafter. However, the issues discussed above relating of disturbances to the gate voltages of other current mirror transistors and the reference current transistor M0 nevertheless remain. These effects may be mitigated, if not eliminated altogether, by turning off the transistors slowly. FIGS. 2 and 3, discussed below, illustrate various embodiments of a bias circuit in which the auxiliary current may be gradually reduced to zero to save power.

FIG. 2 is a schematic diagram of an embodiment of a bias current circuit including an auxiliary transistor and an analog control circuit coupled to a gate terminal thereof. In the embodiment shown, bias circuit 200 includes an embodiment of control circuit 105 and an embodiment of a bias current circuit 101. The bias current circuit 101 is shown here as coupled to an oscillator 203, which is a ring oscillator including an odd number of serially coupled inverters 213 in this particular embodiment. The bias current in this example is provided to a supply voltage node of the inverters, e.g., the node where each inverter would receive a supply voltage in an absence of the bias current connection. It is noted that the disclosure is not limited to this particular type of oscillator or this particular type of application for a bias circuit.

In the embodiment shown, the auxiliary current node is coupled to an auxiliary transistor, M_Aux. The gate terminal of M_Aux is coupled to an analog control circuit 204. The analog control circuit 204 in the embodiment shown is configured to generate a bias voltage, VBias, that is provided to the gate terminal of M_Aux. In one embodiment, analog control circuit 204 may include, e.g., an analog timer that causes discharging of the bias voltage, VBias, over time after the calibration is completed. After the calibration is completed, analog control circuit 204 may be deactivated. As VBias discharges, the auxiliary current, I_Aux, falls. When VBias has fallen a sufficient amount, transistor M_Aux is deactivated, and thus the auxiliary current I_Aux becomes zero. Accordingly, the embodiment shown in FIG. 2 allows for a gradual reduction of the bias current, to a value of zero, after the trimming operation has been completed.

FIG. 3 is a schematic diagram of an embodiment of a bias current circuit including switching circuits arranged to decouple selected current sources from the auxiliary node upon completing a trimming operation. In this particular embodiment, bias circuit 300 implements a control circuit 302 that may stagger both the turn on and turn off of the various switches in bias current circuit 301. The bias circuit 300 in this embodiment provides a bias current, IBias, to an oscillator 303, which produces a periodic output signal, OscOut. Oscillator 303 may be a ring oscillator similar to the one discussed above in reference to FIG. 2, or may by another type of oscillator suitable for receiving a bias current. It is further noted that bias circuit 300 may be suitable for applications other than providing a bias current to an oscillator, and more generally, suitable for any application in which a controlled bias current is desirable.

In this particular embodiment, bias current circuit 301 includes two switches between each current mirror transistors M1-MN, and the auxiliary current node. For example, both S1X and SD1 are implemented between M1 and the auxiliary current node, S2X and SD2 are implemented between M2 and the auxiliary node, and so on. These switches may be used to disconnect a correspondingly current mirror transistor from the auxiliary node upon completion of the trimming operation. This will be discussed in further detail below.

Control circuit 302 in the embodiment shown includes code converter 305, staggering circuit 304, and staggering circuit 306. Code converter 305 in the embodiment shown is configured to receive an incoming code and convert the code into signals that are received by staggering circuit 304. In turn, staggering circuit 304 converts the signals received from code converter 305 into signals to selectively couple a first subset of the current mirror transistors M1-MN to the bias current node while selectively coupling a second subset to the auxiliary current node. As noted above, these switches (e.g., S1, S1X, etc.) may be operated in a complementary manner such that one is closed while the other switch is open. Thus, if S1 is closed, S1X is open, if S2 is open, S2X is closed, etc.

Staggering circuit 304 provides the switch control signals in a staggered manner such that only one pair of switches coupled to a given current mirror transistor are operated on at any given time. For example, staggering circuit 304 may operate switches S1 and S1X on a first clock cycle, S2 and S2X on a next clock cycle, and so forth. Alternatively, staggering circuit 304 may be arranged to operate a small subset of switch pairs at a given time. Operating only one pair of switches or a small subset of switch pairs at a given time allow the bias current value (and thus, the value of the auxiliary current) to be set in a slow, controlled manner. The bias current may be slowly ramped up in such a case, while minimizing voltage disturbances on the gate terminals of the current mirror transistors M1-MN. In the case in which bias circuit 300 is used to trim an oscillator, staggering the turn-on of switches in this manner and gradually ramping up the bias current may accordingly result in a controlled adjustment of the frequency of the output signal, and can also lead to good control of the duty cycle of the output signal, as well as that of any frequency divided signals (e.g., using a clock divider) based on the output signal. As a result of this degree of control, undesirable clock artifacts may be significantly reduced or eliminated altogether.

Staggering circuit 304 in the embodiment shown also provides one or more control signals to staggering circuit 306. In the embodiment shown, staggering circuit 306 is arranged to control the SD switches (e.g., SD1, SD2, etc.). As noted above, upon achieving the desired bias current, it is desirable to turn off the particular ones of current mirror transistors M1-MN that are providing the auxiliary current (and thus not contributing to the bias current). As also noted above, it is desirable to reduce the auxiliary current gradually so as to minimize or eliminate any disturbances to the gate voltages of the current mirror transistors M1-MN. During the trimming operation, each of switches SD1-SDN may be closed such that its corresponding current mirror transistor can be coupled to the auxiliary current node if selected. After the trimming operation is complete, these switches may be opened to reduce the auxiliary current to zero. Similar to the operation described above, the turn off (opening) of the various SD switches may be staggered, e.g., conducted one switch at a time. In one embodiment, all of the SD switches may be opened, irrespective of whether its corresponding transistor is providing a portion of the auxiliary current. In another embodiment, only those SD switches associated with a transistor providing a portion of the auxiliary current (and thus not providing any portion of the bias current) are opened. In either case, the opening of one switch at a time may reduce the auxiliary current in steps until it reaches zero. Furthermore, by opening only one switch at a time, disturbances of the gate voltages on the current mirror transistors may be minimized. This may in turn reduce or eliminate artifacts into a periodic signal produced by an oscillator in applications where the bias current is set in accordance with a frequency trimming operation.

Figure 4:
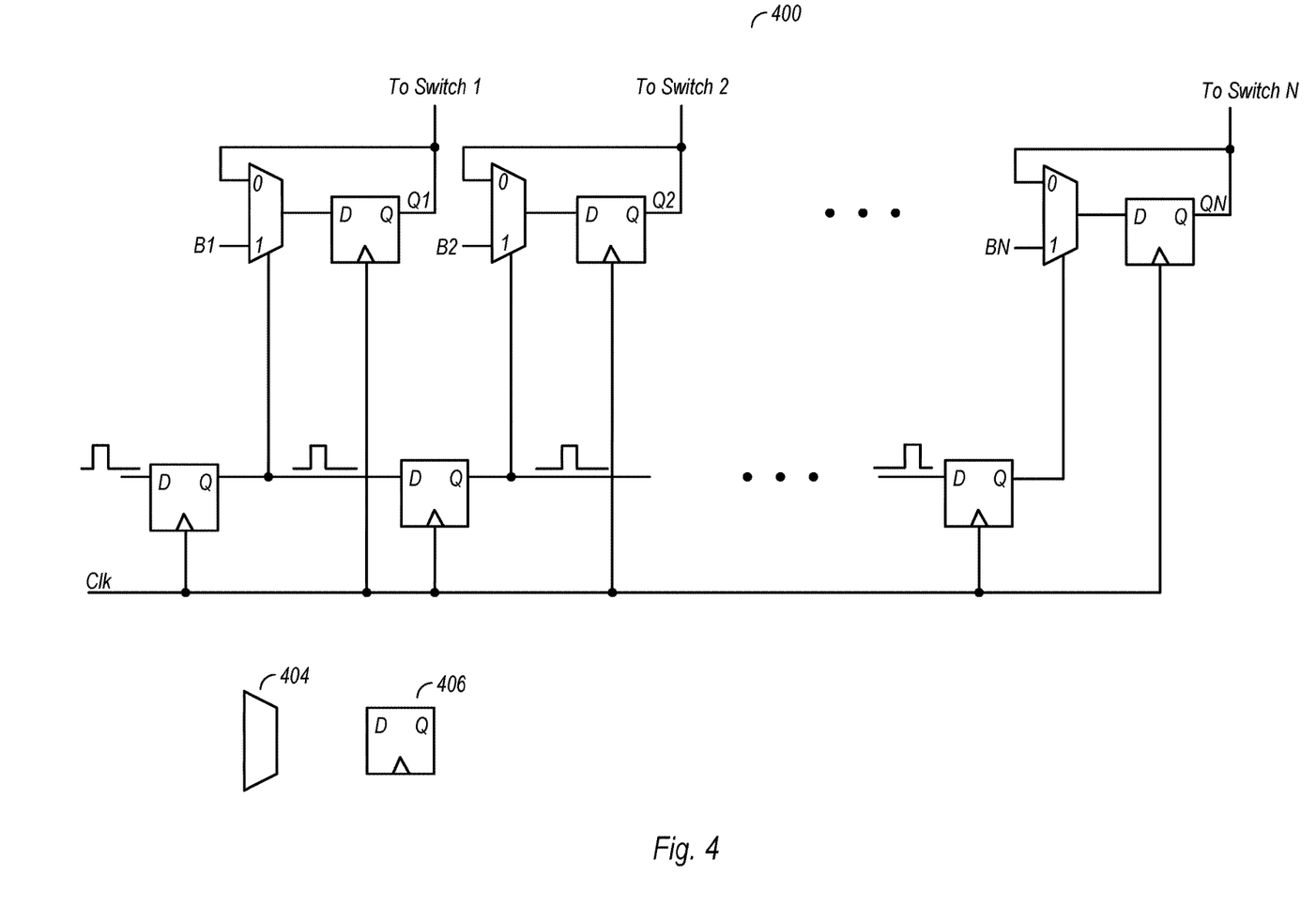
FIG. 4 is a logic diagram of one embodiment of staggering circuitry used in one embodiment of a control circuit for activating/deactivating switches in a staggered manner.

FIG. 4 is a logic diagram of one embodiment of a staggering circuit. Staggering circuit 400 as shown here is an example embodiment that may be used to implement either of the staggering circuits discussed above in reference to FIG. 3. In the illustrated embodiment, staggering circuit 400 includes a number of multiplexers 404 (2 to 1 multiplexers in this instance) and a number of D-type flip-flops 406. The D-type flip-flops 406 are coupled to receive a clock signals from a suitable clock source, which may be external to the staggering circuit and/or the control circuit in which they are implemented.

In the embodiment shown, each of the multiplexers 404 is coupled to receive a corresponding control signal on one input. The other input of each of the multiplexers 404 is coupled to an output of a corresponding D-type flip-flop. For example, a first multiplexer 404 shown in the drawing is coupled to receive a control signal B1 on one input, and on the other input, the Q1 output of the correspondingly coupled flip-flop 406. The Q1 output is similarly provided to a first switch (labeled here as 'Switch 1'), which can be, e.g., S1, SX1, and/or SD1 in the embodiments discussed above. The output of this multiplexer 404 is coupled to the D-input of the corresponding flip-flop 406. The select input of this multiplexer is coupled to the Q output of another flip-flop 406. The arrangement shown for Switch 1 is repeated for every switch that is to be controlled by staggering circuit 400.

Operation of staggering circuit is as follows. The intended control signals are provided to the 'B' inputs of each of the multiplexers 404 (e.g., a first control signal is applied to the 'B1' input of the first multiplexer, a second control signal is applied to the 'B2' input of the next multiplexer, and so on). Thereafter, a pulse is provided to the first one of the lower chain of D-type flip-flops 406. This pulse is then received into the first D-type flip-flop 406 and provided on its Q output in accordance with the clock signal, C1k. This causes the first multiplexer to select the '1' input of the correspondingly coupled multiplexer 404, thereby causing signal on the B1 input to the correspondingly coupled D-type flip-flop 406.

On the next clock cycle, the input signal received on B1 is provided on the Q1 output and thus to a correspondingly coupled switch. Additionally, the signal on the Q1 output is fed back to the '0' input of the corresponding multiplexer 404. This allows the desired state of Q1 to be maintained after the '1' input of the corresponding multiplexer 404 is de-selected. Also on the next clock signal, the pulse is conveyed to the output of the second D-type flip-flop 406 in the lower chain, thereby causing selection of the B2 input on the corresponding multiplexer 404. The process in the first instance of the flip-flop/multiplexer arrangement in the upper portion of the drawing then repeats, with the state of the B2 input conveyed to the Q2 output, to the next switch, and retained via the feedback loop when B2 is de-selected.

As the pulse propagates down the lower chain, each corresponding switch signal is latched into the correspondingly coupled D-type flip-flop 406 and to its corresponding switch. This results in setting one switch to its desired position (open or closed) each clock cycle. For a given clock cycle, only one switch position changes. This may minimize any disturbance on a corresponding current mirror transistor of the bias circuit. As such, the bias current may be gradually set to its desired value (when staggering circuit 400 is used to operate the S1/S1X switches), while the auxiliary current, upon completing the trimming operation, may gradually be reduced to zero (when staggering circuit 400 is used to operate the SD switches).

Figure 5:
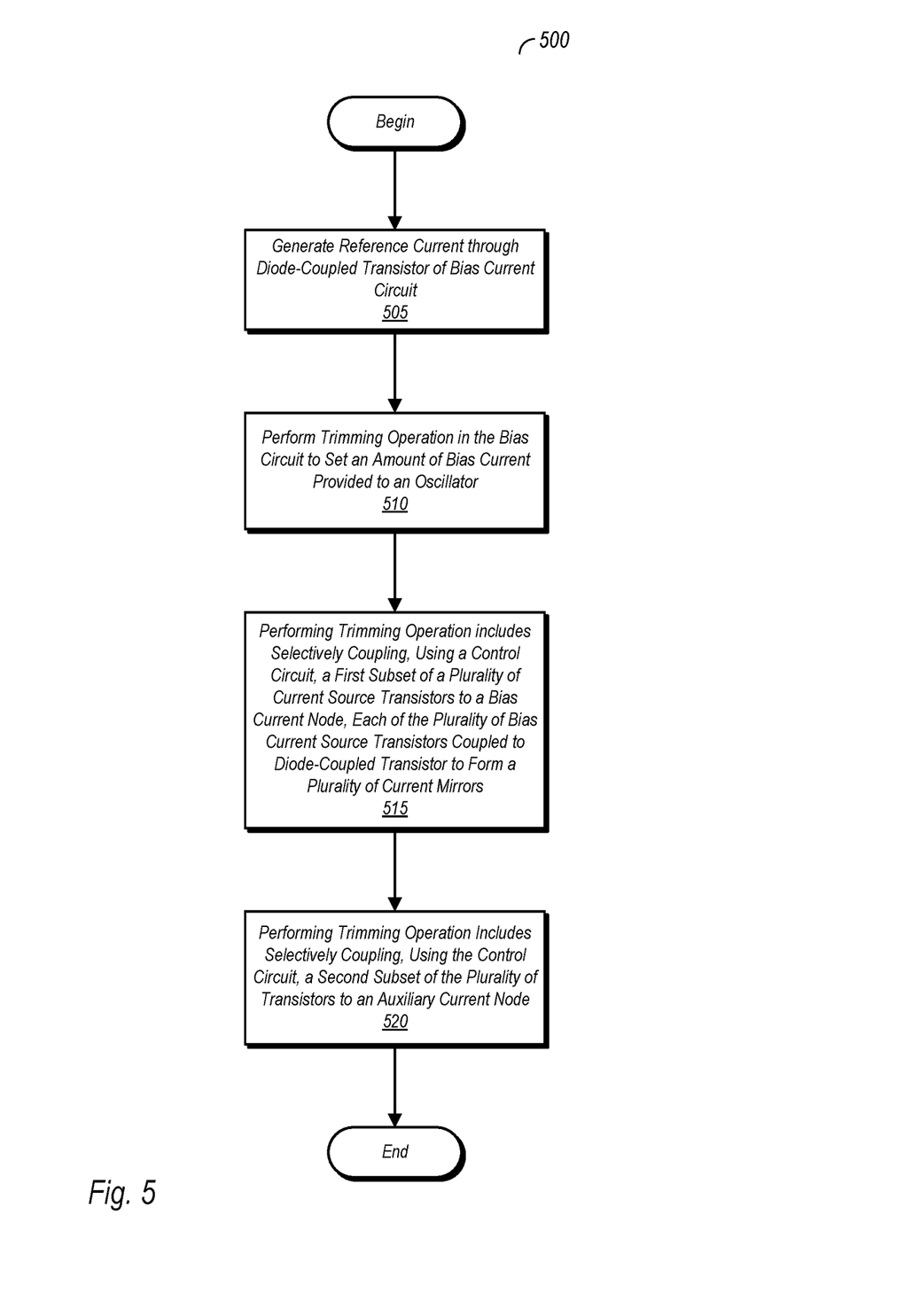
FIG. 5 is a flow diagram of one embodiment of a method for performing a trimming of a bias current produced by a bias current circuit.

FIG. 5 is a flow diagram illustrating one embodiment of a method for performing a trimming of a bias current produced by a bias current circuit. Method 500 may be performed by various embodiments of the circuitry shown in FIGS. 1-4 and discussed above. Other circuitry embodiments capable of performing method 500 may also fall within the scope of this disclosure.

Method 500 includes generating a reference current through a diode-coupled transistor of a bias current circuit (block 505). The method also includes performing a trimming operation in the bias current circuit in order to set an amount of bias current provided to an oscillator (block 510). Performing the trimming operation includes selectively coupling, using a control circuit, a first subset of a plurality of current source transistors to a bias current node, wherein each of the plurality of current source transistors is coupled to the diode-coupled transistor to form a plurality of current mirrors (block 515). The trimming operation also includes selectively coupling, using the control circuit, a second subset of the plurality of current source transistors to an auxiliary current node (block 520).

In some embodiments, the method includes the control circuit, responsive to completing the trimming operation, causing an auxiliary current through the auxiliary current node to be reduced to zero. Causing the auxiliary current to be reduced to zero may, in some embodiments, include the control circuit decoupling the second subset of the plurality of current source transistors from the auxiliary current node responsive to completion of the trimming operation, wherein said decoupling includes sequentially decoupling individual current source transistors of the second subset.

Various embodiments of the method also include selectively coupling the first subset of the plurality of current sources to the bias current node comprises closing corresponding ones of a first plurality of switches in a staggered manner. Some embodiments may also include setting a value of the bias current in accordance with a code provided to the control circuit.

Figure 6:
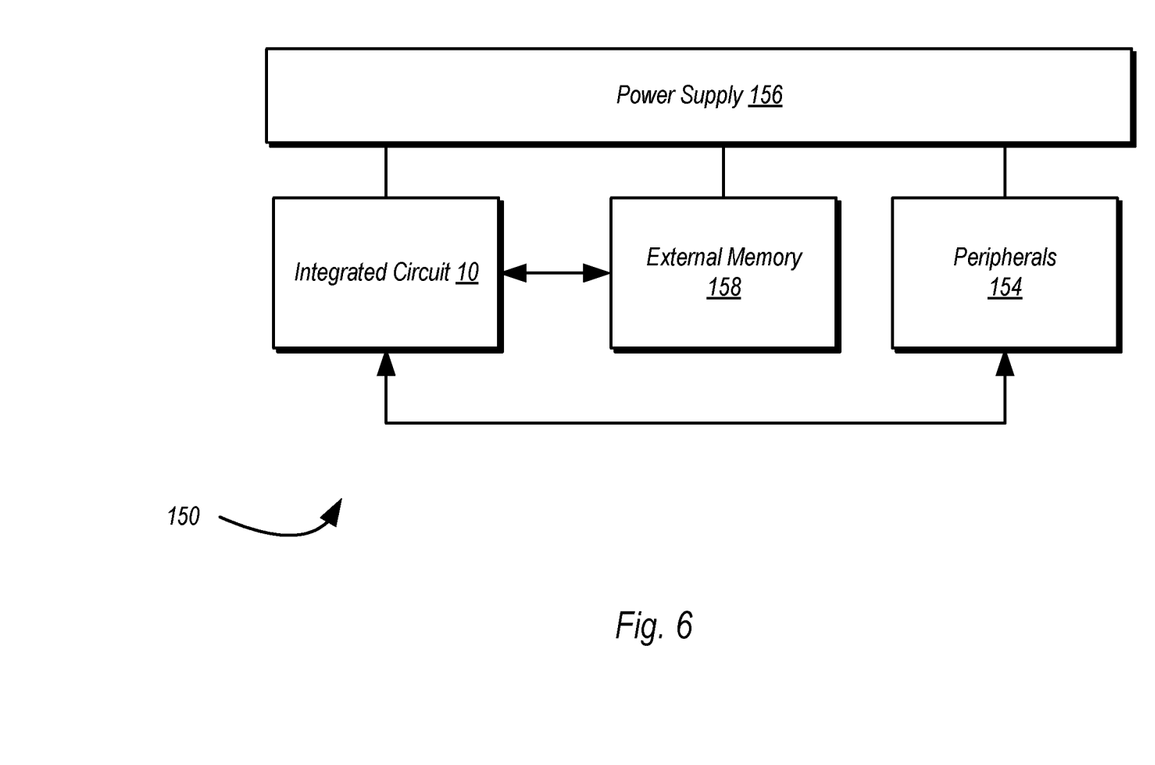
FIG. 6 is a block diagram of one embodiment of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments, IC 10 or peripherals 154 may include one or more instances of a bias circuit. The bias circuits within system 150 may be in any of the various embodiments discussed above or otherwise falling within the scope of this disclosure. Circuits that consume the bias current produced by a given instance of a bias circuit can include an oscillator as discussed above, but can also be other types of circuitry that utilize a bias current.

Numerous variations and modifications will become apparent to those skilled in the art once the above disclosure is fully appreciated. It is intended that the following claims be interpreted to embrace all such variations and modifications.

What is claimed is:

1. A circuit comprising:
an oscillator; and
a bias circuit configured to provide a bias current to the oscillator, via a bias current node, wherein the bias circuit includes:
a diode-coupled transistor;
a plurality of current source transistors coupled to the diode-coupled transistor to form a plurality of current mirrors;
a first plurality of switches, wherein ones of the first plurality of switches are coupled between the bias current node and corresponding ones of the plurality of current source transistors; and
control circuitry configured to control an amount of bias current provided to the oscillator by selectively coupling a first subset of the plurality of current source transistors to the bias current node, and further configured, during a trimming operation, to selectively couple a second subset of the plurality of current source transistors to an auxiliary current node, wherein the control circuitry is configured to control respective states of the ones of the first plurality of switches.

2. The circuit as recited in claim 1, wherein the control circuitry is further configured to decouple the second subset of the plurality of current source transistors from the auxiliary current node responsive to completing the trimming operation.

3. The circuit as recited in claim 1, further comprising:
a second plurality of switches having respective first terminals coupled to corresponding ones of the current source transistors;
a third plurality of switches having respective first terminals coupled to second terminals of respective ones of the second plurality of switches, and respective second terminals coupled to the auxiliary current node;
wherein the control circuitry is configured to control the first and second pluralities of switches such that corresponding ones of the first and second pluralities of switches are in opposite states during the trimming operation.

4. The circuit as recited in claim 1, further comprising a resistor having a first terminal coupled to a gate terminal of the diode-coupled transistor, and a second terminal coupled to respective gate terminals of ones of the current source transistors.

5. The circuit as recited in claim 1, further comprising an auxiliary transistor coupled between the auxiliary node and a ground node.

6. The circuit as recited in claim 5, further comprising an analog control circuit configured to provide a bias voltage to a gate terminal of the auxiliary transistor during the trimming operation, wherein the control circuitry is configured to disconnect the bias circuit from the gate terminal of the auxiliary transistor responsive to completing the trimming operation.

7. The circuit as recited in claim 1, further comprising a reference current source coupled to the diode-coupled transistor.

8. The circuit as recited in claim 1, wherein the plurality of current source transistors are unary weighted with respect to one another.

9. The circuit as recited in claim 1, wherein the plurality of current source transistors are binary weighted with respect to one another.

10. A method comprising:
    generating a reference current through a diode-coupled transistor of a bias current circuit;
    performing a trimming operation in the bias current circuit in order to set an amount of bias current provided to an oscillator, wherein performing the trimming operation includes:
        selectively coupling, using a control circuit, a first subset of a plurality of current source transistors to a bias current node, wherein ones of the plurality of current source transistors are coupled to the diode-coupled transistor to form a plurality of current mirrors, wherein selectively coupling the first subset of the plurality of current sources to the bias current node comprises closing corresponding ones of a first plurality of switches in a staggered manner; and
        selectively coupling, using the control circuit, a second subset of the plurality of current source transistors to an auxiliary current node.

11. The method as recited in claim 10, further comprising the control circuit, responsive to completing the trimming operation, causing an auxiliary current through the auxiliary current node to be reduced to zero.

12. The method as recited in claim 11, further comprising the control circuit decoupling the second subset of the plurality of current source transistors from the auxiliary current node responsive to completion of the trimming operation, wherein said decoupling includes sequentially decoupling individual current source transistors of the second subset.

13. The method as recited in claim 10, further comprising setting a value of the bias current in accordance with a code provided to the control circuit.

14. The method of claim 10, further comprising the control circuit controlling a second plurality of switches such that ones of the first and second pluralities of switches are in opposite states during the trimming operation, the second plurality of switches having respective first terminals coupled to corresponding ones of the current source transistors.

15. A system comprising:
    a control circuit; and
    a bias current circuit having a plurality of current sources, wherein the control circuit is configured to control an amount of bias current provided by the bias circuit, wherein controlling an amount of bias current comprises the control circuit selectively activating a first subset of the plurality of current sources to provide the bias current to a bias current node, wherein selectively activating the first subset of the plurality of current sources to the bias current node comprises closing corresponding ones of a first plurality of switches in a staggered manner, and further comprises the control circuit selectively coupling a second subset of the plurality of current sources to provide an auxiliary current to an auxiliary current node during a trimming operation.

16. The system as recited in claim 15, wherein the bias current circuit is configured to reduce the auxiliary current to zero responsive to completing the trimming operation.

17. The system as recited in claim 15, wherein the bias current circuit includes a diode-coupled transistor, and wherein the plurality of current sources comprises a plurality of current source transistors coupled to the diode-coupled transistor to form a plurality of current mirrors.

18. The system as recited in claim 17, wherein ones of the plurality of current source transistors are weighted differently from other ones of the plurality of current source transistors.

19. The system as recited in claim 15, further comprising an oscillator coupled to receive the bias current from the bias current circuit, wherein a frequency of an output signal provided by the oscillator is at least partly dependent on the bias current.

20. The system of claim 15, wherein the bias circuit further includes a second plurality of switches having respective first terminals coupled to corresponding ones of the current sources, wherein the control circuit is configured to control the first and second pluralities of switches such that corresponding ones of the first and second pluralities of switches are in opposite states during the trimming operation.

* * * * *